( 12 ) United States Patent
Zinser (10) Patent No.: US 7,639,821 B2
(45) Date of Patent: Dec. 29, 2009

(54) SYSTEM AND METHOD FOR IMPROVED DETECTION OF AM SIGNALS

(75) Inventor: Richard L. Zinser, Niskayuna, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 1084 days.

(21) Appl. No.: 11/031,121

(22) Filed: Jan. 6, 2005

(65) Prior Publication Data

US 2006/0148441 A1 Jul. 6, 2006

(51) Int. Cl.
*H04H 20/49* (2008.01)
(52) U.S. Cl. .................... 381/15; 329/327; 329/358; 329/359; 455/150.1; 455/196.1; 455/255
(58) Field of Classification Search .................. 381/15, 381/16; 375/320, 327; 329/327, 358, 359; 455/150.1, 196.1, 255, 324, 337
See application file for complete search history.

(56) References Cited

U.S. PATENT DOCUMENTS

| 4,273,958 A | * | 6/1981 | Hirata | 381/15 |
| 4,339,631 A | * | 7/1982 | Nishioka | 455/230 |
| 4,901,244 A | * | 2/1990 | Szeto | 702/77 |
| 5,003,621 A | * | 3/1991 | Gailus | 455/209 |
| 5,222,144 A | * | 6/1993 | Whikehart | 381/15 |
| 5,561,716 A | * | 10/1996 | Kasser et al. | 381/15 |

* cited by examiner

*Primary Examiner*—Xu Mei
*Assistant Examiner*—Jason R Kurr
(74) *Attorney, Agent, or Firm*—Bracewell & Giuliani LLP (57) ABSTRACT

A software defined radio detects an amplitude modulated (AM) signal contained within a received signal. This detection involves first receiving a radio frequency (RF) signal that contains the AM signal modulated about a carrier frequency ($f_c$). The RF signal is downconverted using a first local oscillator having a frequency $f_{lo}$. An in-phase (I) channel signal and a quadrature (Q) channel signal are produced. From the I-channel signal, a relationship between the carrier frequency and the frequency of the local oscillator is determined with a frequency detector. The downconverted carrier signal of the I-channel signal is used to create a second set of signals with proper phases and frequencies that can be used to rotate the I-channel and Q-channel signals to account for differences between the downconverted $f_c$ and DC. From the I-channel and Q-channel signals, a phase difference between the I-channel and Q-channel signals is determined so that the processed I-channel and Q-channel signals can be properly combined. Properly combining the processed (rotated) I-channel and Q-channel signals results in a demodulated AM signal.

19 Claims, 7 Drawing Sheets

SYSTEM AND METHOD FOR IMPROVED DETECTION OF AM SIGNALS

TECHNICAL FIELD OF THE INVENTION

The present invention relates generally to the detection of amplitude modulated (AM) radio signals, and more particularly to the improved detection of AM signals in software implemented radio receiver architectures.

BACKGROUND OF THE INVENTION

Software defined radio (SDR) combines hardware and software technologies that enable reconfigurable system architectures for wireless networks and user terminals. SDR provides many improvements over traditional hardware radio and software-controlled radio. In a hardware radio, the radio is implemented using hardware components only and cannot be modified except through physical intervention. In software-controlled radio, (SCR) only the control functions of the radio are implemented in software, and thus only limited functions are changeable using software. In contrast, SDR technology uses software and digital processing to perform the functions performed by analog hardware components in hardware radio and SCR. The degree to which these functions are moved from hardware to software varies from implementation to implementation.

As SDR functions migrate from fixed-function analog hardware to digital implementations, concepts which work well in the analog domain pose unique problems in the digital domain. For example, the super heterodyne or dual-conversion transceiver receives a signal that is downconverted to baseband in two stages. This two-stage receiver and transmitter architecture uses an RF block to convert an incoming signal to an intermediate frequency (IF) where image suppression and channel selection are performed with a narrow channel-select filter, such as a SAW, or ceramic filters. The now-filtered signal is then further downconverted to the baseband frequency. This radio architecture provides excellent sensitivity and selectivity characteristics. This comes at the expense of more complexity and cost, for such radio implementation typically requires an RF chip and an IF chip as well as discrete SAW filters and VCO/synthesizers.

An alternative to the super heterodyne receiver architecture is the Zero-IF receiver architecture, also known as a single-conversion, directs conversion or homodyne receiver architecture. Zero-IF receiver architecture enables direct conversion of RF signals to baseband without the use of an IF. Zero-IF architectures reduce component count, cost, system complexity, size, and power consumption. Despite these benefits, amplitude modulation (AM) current implementations of Zero-IF architecture fail to work well.

An envelope detector operating at either the carrier frequency in the simplest AM radios or, more typically, at an IF in super heterodyne radios are included in AM detection implementations. However, envelope detection in Zero-IF architecture has not been efficiently implemented because the Zero-IF receiver demodulates the incoming signal from RF to DC. Envelope detectors do not perform well at low frequencies near DC. This is particularly true for digital signals using AM modulation schemes, as the wide bandwidth renders cascaded integrator-comb (CIC) decimation filters less effective and also results in an image frequency problem. Ripple and negative peak clipping also are common issues associated with envelope detection at low frequencies near DC.

An alternate solution for AM detection employs a synchronous detector. However, the synchronous detector also has shortcomings. If there is any discrepancy between the actual RF carrier frequency and the receiver's local oscillator frequency, as occurs when the system is not tuned accurately, the output signal will not be centered. Temperature and manufacturing process variations can also introduce discrepancies between desired and actual frequency output. Regardless of cause, any frequency mismatch can introduce several unwelcome effects. For example, incorrect phase can cancel the output signal completely, resulting in no signal, or the output could be totally garbled because the reflected LSB harmonics are not aligned with the USB harmonics. Additionally, an overpowering low-frequency tone can be generated by the offset carrier.

SUMMARY OF THE INVENTION

The present invention provides an AM radio implementation that substantially addresses the above-identified need for improved digital AM signal detection and Zero-IF receiver architectures. The Zero-IF Receiver Signal Processors (RSP) architecture translates signals to DC. Zero-IF receiver architecture enables direct conversion of analog RF signals to digital baseband format. Zero-IF architectures reduce component count, cost, system complexity, size, and power consumption. In practice, many of the benefits offered by a Zero-IF architecture are offset by a series of problems introduced by the digital components used in SDR.

The present invention detects an amplitude modulated (AM) signal contained within a received signal. One method of implementing this detection involves first receiving a radio frequency (RF) signal that contains the AM signal modulated about a carrier frequency ($f_c$). The RF signal is downconverted using a first local oscillator having a frequency $f_{lo}$. An in-phase (I) channel signal and a quadrature (Q) channel signal are produced. From the I-channel signal, one may determine a relationship between the carrier frequency and the frequency of the local oscillator with a frequency detector. The down converted carrier signal of the I-channel signal is used to create a second set of signals with proper phases and frequencies that can be used to rotate the I-channel and Q-channel signals to account for differences between the downconverted $f_c$ and DC. From the I-channel and Q-channel signals one may determine a phase difference between the I-channel and Q-channel carrier signals in order to determine how the processed I-channel and Q-channel signals are to be combined. Properly combining the processed (rotated) I-channel and Q-channel signals may result in a demodulated AM signal.

To improve the output, a DC level associated with the demodulated AM signal may be determined and removed from the signal. Then, automatic gain control (AGC) may be applied to the signal. Additionally, the signal may be filtered, for example with a low pass filter, to further improve the quality of the demodulated AM signal.

Combining an I-channel signal and a Q-channel signal may utilize a second set of local oscillators to produce the second set of signals with proper phases and frequencies to rotate the I-channel and Q-channel signals to account for differences between the downconverted $f_c$ and DC. The I-channel and Q-channel signals' phase difference determines how the processed (rotated) I-channel and Q-channel signals are to be combined. For example, the I-channel signal and Q-channel signal may be added when the frequency in a local oscillator is greater than that of the carrier frequency (or the Q-channel leads the I-channel signal). Similarly, the Q-channel signal may be subtracted from the I-channel signal when the carrier frequency is greater than that of the local oscillator (or the I-channel leads the Q-channel signal).

Another embodiment provides an apparatus operable to detect AM signals. This apparatus includes a receiver and a processing circuit. The receiver receives RF signals containing the AM signal modulated about a carrier frequency. The processing circuit operably couples to the receiver, as well as a first and second local oscillator. The processing circuit downconverts the RF signal with the first local oscillator wherein the first local oscillator has a frequency $f_{l_o}$ and phase in order to produce an in-phase (I-channel) signal and quadrature (Q-channel) signal. The processing circuit then determines the relationship between the carrier frequency and the frequency of the local oscillator from the I-channel signal. The processing circuit also determines a phase difference between the I-channel signal and the Q-channel signal. The processing circuit then will mix (rotate) the I-channel signal and the Q-channel signal with the output of a second set of local oscillators that have frequencies and phases determined by the down converted carrier signal. These rotated signals are then combined according to the phase difference to produce the demodulated AM signal.

Another embodiment provides a digital AM signal detector. This digital AM signal detector includes a receiver, a frequency detector, a first local oscillator, a second set of local oscillators, a set of mixers, a processing circuit, a phase detector, and a combiner. The receiver is operable to receive RF signals containing the AM signal modulated about the carrier frequency. The frequency detector may detect the carrier frequency ($f_c$) about which the AM signal is modulated within the RF signal. The output of the frequency detector may be used as an input to determine the frequency and phase of all local oscillators. The first local oscillator may substantially match its frequency and phase to the carrier frequency as detected by the frequency detector. The processing circuit couples to the first local oscillator and down converts the RF signal to produce an I-channel signal and Q-channel signal. The mixers multiply the I-channel and Q-channel signals with the output of the second set of oscillators. The frequencies and phases of the second set of oscillators are determined by the downconverted carrier signal. The phase detector determines the phase difference between the I-channel and Q-channel signals and provides this information to a combiner. These rotated signals are then combined according to the phase difference to produce the demodulated AM signal. The combiner may couple to a logic controller operable to direct the combiner to combine the rotated I-channel signal and Q-channel signals by adding or subtracting signals based on the phase difference between the I-channel signal and the Q-channel signal.

Additional embodiments may further contain circuitry operable to determine and remove a DC level associated with the demodulated AM signal. Also, an automatic gain control (AGC) can be applied to produce an enhanced demodulated AM signal. A low pass filter may also be applied to the output in order to further improve the demodulated AM signal.

The present invention allows Zero-IF radio systems to employ Amplitude Modulation (AM) without experiencing the problems commonly associated with detecting AM signals at or near DC with an envelope detector, including the ineffectiveness of cascaded integrator-comb (CIC) decimation filters and image frequency problems. Also, ripple and negative peak clipping associated with envelope detection at low frequencies near DC may be reduced or eliminated.

This solution reduces problems that occur when discrepancies exist between the actual RF carrier frequency and the receiver's local oscillator frequency. These discrepancies occur when the system is not tuned accurately, relative motion induces discrepancies, or environmental (i.e., temperature, pressure and humidity) and manufacturing process variations introduce discrepancies between desired and actual frequency output.

Another advantage is realized by implementing AM modulation schemes within a Zero-IF receiver architecture employing a software-defined radio (SDR) architecture. Some or all of the architecture can be implemented with analog circuits, discrete components or subassemblies combining a variety of components. Alternatively, the architecture may employ microcontrollers that functionally implement any combination of the system components through software. Such embodiments are particularly advantageous if the direct conversion receiver communicatively couples to a microcontroller with digital I/O-channels and/or a digital-to-analog converter (DAC) present for other purposes, where such resources can be cross-utilized to implement digital Zero-IF receiver architecture.

BRIEF DESCRIPTION OF THE DRAWINGS

For a more complete understanding of the present invention and the advantages thereof, reference is now made to the following description taken in conjunction with the accompanying drawings in which like reference numerals indicate like features and wherein.

DETAILED DESCRIPTION OF THE INVENTION

Preferred embodiments of the present invention are illustrated in the FIGUREs, like numerals being used to refer to like and corresponding parts of the various drawings.

The present invention employs a Zero-IF demodulator to convert a received AM signal contained within an RF signal to an in-phase (I-channel) and quadrature (Q-channel) signal at or near DC. The AM detector processes the I-channel signal to compute the downconverted carrier frequency and phase within the I-channel signal. This computed frequency and phase serve as control inputs to local oscillators. A first local oscillator may substantially match its frequency and phase to the carrier frequency as detected by the frequency detector. The output of a second set of local oscillators mixes with the I-channel and Q-channel signals to further demodulate the I-channel and Q-channel signals to DC. The I-channel and Q-channel signals are combined in accordance with an algorithm based on the relative phase difference between I-channel and Q-channel signals. After combining, DC level is measured and removed from the resultant signal, and DC level is used to compute gain for an automatic gain control (AGC) algorithm. The resultant signal is amplified according to the AGC algorithm and filtered to provide a synchronously demodulated output signal.

Figure 1:
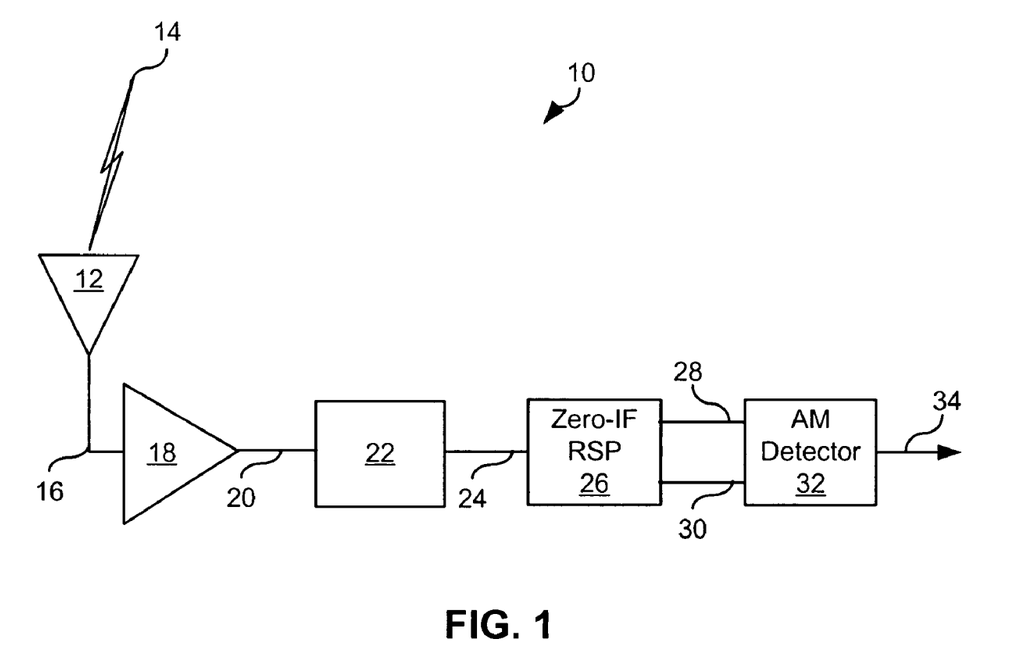
FIG. 1 is a system block diagram of a digital communications receiver that incorporates embodiments of the present invention, including a direct conversion (also known as a Zero-IF or homodyne) I/Q demodulator and an AM detector.

FIG. 1 is a system diagram of receiver 10 that produces a synchronously demodulated AM signal. Receiver 10 includes an antenna 12, operable to receive RF signal 14 containing an AM signal, a Zero-IF (also known as a direct conversion or homodyne) demodulator with quadrature (I/Q format) output and an AM detector. Antenna 12 converts received RF signal 14 into a modulated signal 16. Modulated signal 16 as shown enters low noise amplifier 18 that processes signal 16 to produce amplified signal 20. Amplified signal 20 enters filter 22 to produce signal 24 that enters direct conversion receiver 26. The processes and components of receiver 26 will be discussed in further detail. Direct conversion receiver 26 tunes to the carrier frequency (fc) of signal 24 to produce demodulated signals 28 and 30, where demodulated signal 28 and 30 are in quadrature. Demodulated signal 28 is designated the in-phase (I-channel) signal and demodulated signal 30 is designated the quadrature (Q-channel) signal. Demodulated signals 28 and 30 enter AM detector 32 to produce demodulated signal 34. In this embodiment, direct conversion receiver 26 has quadrature (I/Q) output. An alternate embodiment may have an in-phase output and a phase shifter to produce an I-channel and Q-channel output.

Some or all of the architecture can be implemented with analog circuits, discrete components or subassemblies combining a variety of components. Alternatively, the architecture may employ microprocessor(s) that functionally implement any combination of the system components through software. Such embodiments are particularly advantageous if the direct conversion receiver communicatively couples to a microcontroller with digital I/O-channels and/or a digital-to-analog converter (DAC) present for other purposes, where such resources can be cross-utilized to implement digital Zero-IF receiver architecture.

These microprocessor(s) may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. Coupled memory may be a single memory device or a plurality of memory devices. Such a memory device may be a read-only memory, random access memory, volatile memory, non-volatile memory, static memory, dynamic memory, flash memory, cache memory, and/or any device that stores digital information. Note that when the microprocessor(s) implement one or more of its functions via a state machine, analog circuitry, digital circuitry, and/or logic circuitry, the memory storing the corresponding operational instructions may be embedded within, or external to, the circuitry comprising the state machine, analog circuitry, digital circuitry, and/or logic circuitry. The coupled memory stores, and the microprocessor (s) execute, operational instructions corresponding to at least some of the steps and/or functional blocks illustrated in FIGS. 1 through 7.

Figure 2:
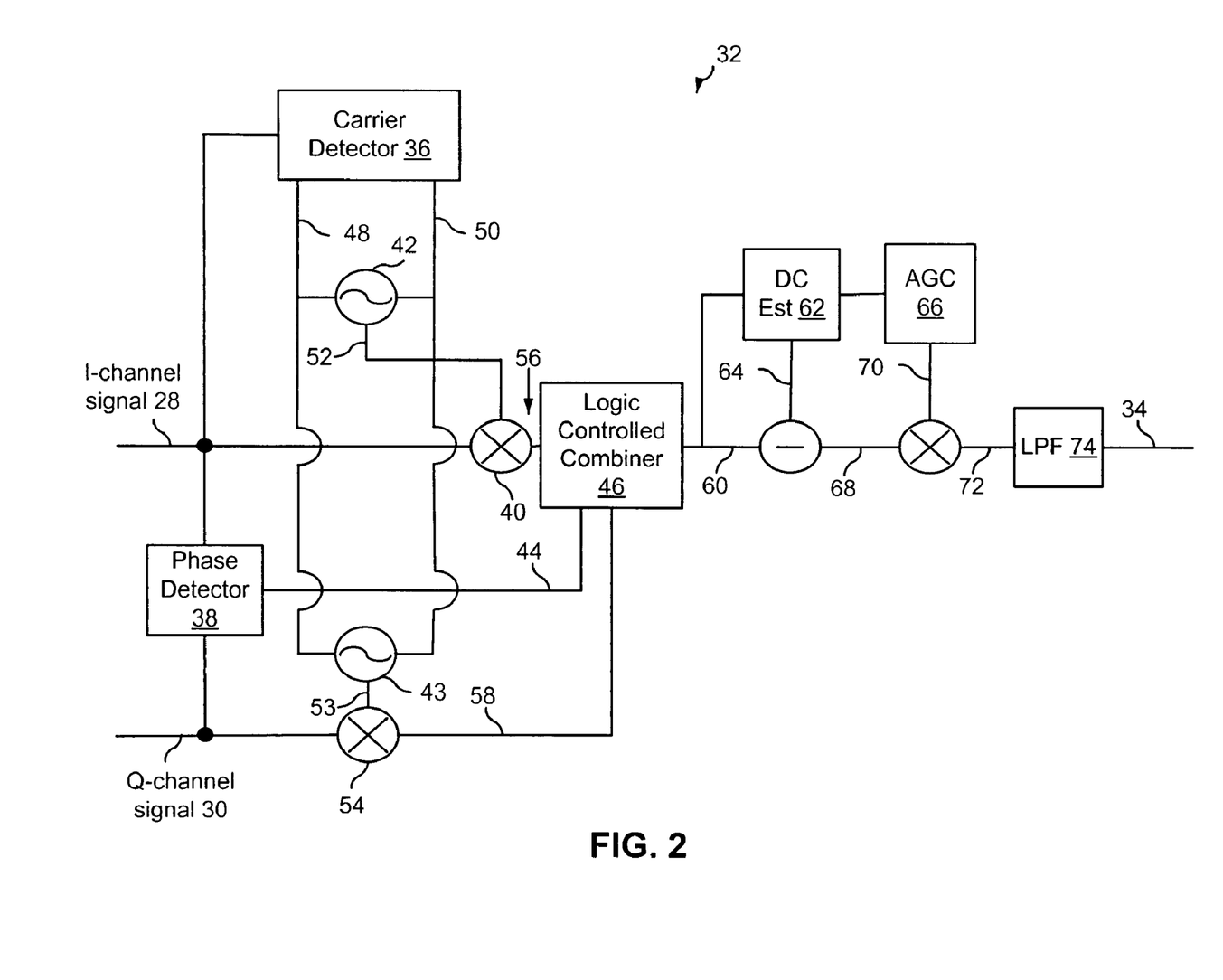
FIG. 2 shows a system block diagram of an AM detector that incorporates aspects of the subject invention.

FIG. 2 is a block diagram of AM detector 32 in accordance with an embodiment of the present invention. AM detector 32 receives I-channel signal 28 and Q-channel signal 30 as inputs. The I-channel signal is provided to carrier detector 36, relative phase detector 38, and mixer 40. Carrier detector 36 determines the downconverted carrier frequency or the position of the carrier frequency within the I-channel signal. This serves as an input to local oscillators 42 and 43. This may also be used as an input to a local oscillator within direct conversion receiver 26 of FIG. 1. Carrier detector 36 analyzes I-channel signal 28 to compute frequency and phase information associated with I-channel signal 28. Frequency information in this embodiment is contained in output 48 while phase information is contained in output 50 both of which are provided as inputs to local oscillators 42 and 43. The local oscillators 42 and 43 take into account any differences between the carrier frequency and that of the first local oscillator within direct conversion receiver 26 used to substantially downconvert the received RF signal to baseband. The phase of local oscillators 42 and 43 are offset by 90 degrees.

Relative phase detector 38 receives as inputs both the I-channel signal 28 and Q-channel signal 30 provided to AM detector 32. Phase detector 38 compares the phases of the I-channel and Q-channel signals to determine a relative phase difference between the I-channel and Q-channel signals. Information regarding the relative phase difference between the I-channel and Q-channel signals is provided as output 44 from the phase detector 38 to a logic controlled combiner 46.

Local oscillator 42 provides output signal 52 that is multiplied with I-channel signal 28 within mixer 40. Likewise, local oscillator 43 provides output signal 53 that is multiplied by Q-channel signal 30 within mixer 54. The resultant mixed (rotated) I-channel signal 56 and Q-channel signal 58 along with the relative phase difference 44 are provided as inputs to logic controlled combiner 46. This logic controlled combiner adds or subtracts the I-channel signal 56 and Q-channel signal 58 in accordance with predetermined rules. For example, if the phase difference output 44 indicates that I-channel signal 28 leads Q-channel signal 30, then logic controlled combiner 46 subtracts Q-channel signal 58 from I-channel signal 56 to produce output 60. Alternatively, if the output of phase detector 38 indicates that the Q-channel signal 30 leads I-channel signal 28, then the output of logic controlled combiner 46 is defined by the sum of I-channel signal 56 and Q-channel signal 58. Output 60 of logic controlled combiner 46 is the demodulated AM signal.

Additionally, AM detector 32 may apply a DC level correction, automatic gain control, and filter processing to further improve the output signal of the AM detector. DC estimator 62 samples output 60 of logic controlled mixer 46 to determine a DC level associated with output 60. DC estimator 62 provides an output signal 64 which is subtracted from the demodulated AM signal provided to remove the DC level associated with the output of the logic controlled mixer. Additionally, this DC level estimator may provide an input to automatic gain control circuit (AGC) 66. AGC circuit 66 provides for stabilization of the receiver's output signal by comparing that signal, in this embodiment signal 60, to an internal reference level. This prevents amplitude variation with time and/or location. This is particularly useful in mobile applications where varying location alters the received signal strength. Thus, AGC circuit 66 can automatically compensate for such variations to maintain a set output level. The DC level corrected signal 68 is processed using output 70 of AGC circuit 66 to produce an output 72 which may be optionally filtered with a filter such as low pass filter 74 to provide output 34 of the AM detector.

The detection of AM signals with software-implemented radio is made possible with synchronous detection. The above embodiment addresses problems associated with having the local oscillator of the direct conversion receiver not properly tuned to the carrier frequency. This improper tuning results in incorrect phase and can cancel the output signal completely. The above embodiment may be implemented via a digital signal processor (DSP) and provides for automatic frequency control and phase lock.

To understand the rationale behind the logic controlled combiner, consider the polarity of the I signal 28 and Q signal 30 at the output of digital receiver 26. Table 1 depicts a case where the $f_c$ is greater than that of $f_{lo}$. The I-channel and Q-channel signals are broken down as depicted in table 1. In all cases, the I-channel component of the carrier frequency and the sideband above and below the local oscillator is positive. However, for the Q-channel signal, only the sideband below that of the local oscillator is positive. Also note that table 1 shows only the "difference" products of the mixing process (those signals near DC that are centered on the absolute value of the difference between $f_{lo}$ and $f_c$.) The "sum" products of the mixer (those centered at $f_{lo}+f_c$) are rejected by the filtering in the digital receiver.

TABLE 1

(CASE $f_c > f_{lo}$)

| Component | I | Q |
|---|---|---|
| fc | cos(−f) = +cos(f) | sin(−f) = −sin(f) |
| sideband below LO | cos(f) = +cos(f) | sin(f) = +sin(f) |
| sideband above LO | cos(−f) = +cos(f) | sin(−f) = −sin(f) |

Table 2 depicts the components and results associated with rotation (mixing) by the second set of adaptive local oscillators having a frequency equal to the difference of the carrier frequency and the frequency of the first local oscillator. This table is broken down to show both the "sum" and "difference" products of the mixing process, since both lie within the range of frequencies to be demodulated. In table 2, the nomenclature is as follows: "cos(f)" refers to a demodulated signal in the proper spectral position, while "cos(img)" refers to a demodulated signal that has been translated to the image frequency position $f_c-f_{lo}$. For example, the carrier frequency component in the I-channel signal is translated to both DC and the image frequency by the second mixer. Table 2 illustrates the reasons associated with subtracting the Q-channel signal from the I-channel signal after rotation. In this instance, all the image products are cancelled and the output consists of DC and the demodulated signal in the correct spectral position. This also illustrates one reason why it is desirable to remove the DC component after processing the signals with logic controlled combiner 46.

TABLE 2

(Rotation by second (adaptive) LO at $|f_c - f_{lo}|$)

| Component | I sum | I diff | Q sum | Q diff |
|---|---|---|---|---|
| fc | +DC | +cos(img) | +cos(img) | −DC |
| sideband below LO | +cos(img) | +cos(f) | −cos(f) | +cos(img) |
| sideband above LO | +cos(img) | +cos(−f) (=cos(f)) | cos(img) | −cos(f) |

Figure 3:
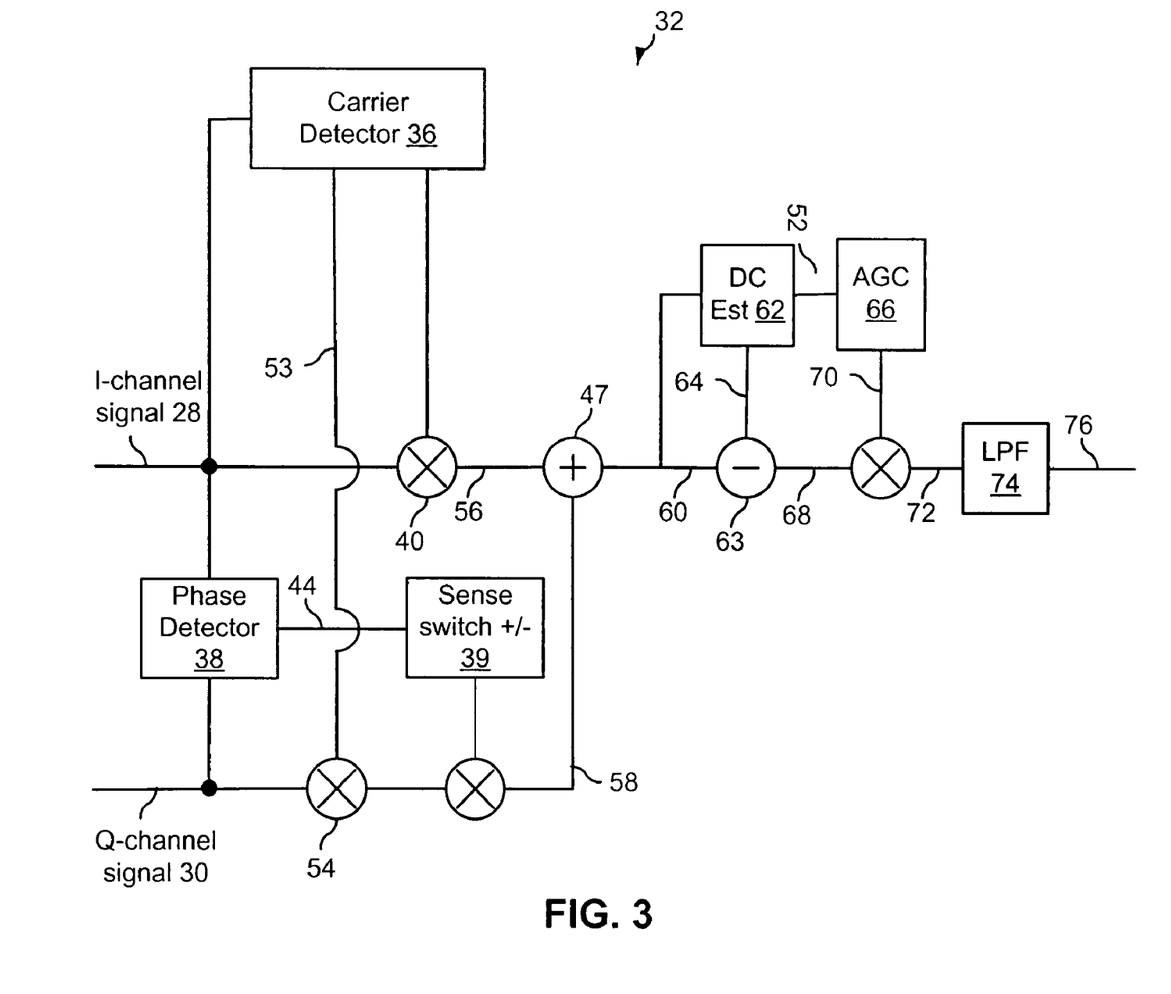
FIG. 3 shows a system block diagram of an AM detector that incorporates aspects of the subject invention.

FIG. 3 depicts another embodiment of AM detector 32. Here, AM detector 32 receives I-channel signal 28 and Q-channel signal 30, which are both received by phase detector 38. I-channel signal 28 is also received by carrier detector 36, which produces an output in combination with a second set of local oscillators having frequencies and phases determined by the position of the carrier frequency within I-channel signal 28. Relative phase detector 38 provides an input to sense switch 39. Q-channel signal 30 is multiplied with the output of carrier detector 36 as controlled by mixer 54. The output of sense switch 39 is applied to the output of mixer 54 such that when combined by adder 47, the rotated Q-channel signal produced by mixer 54 is either added to or subtracted from the rotated I-channel signal. The output of adder 47 is provided to DC estimator module 62, which produces a DC estimate that is removed from the adder's output. The DC estimator's output is also provided to AGC circuit 66, which applies AGC to signal 68. This signal is then filtered by low-pass filter 74 to yield output 34.

Figure 4:
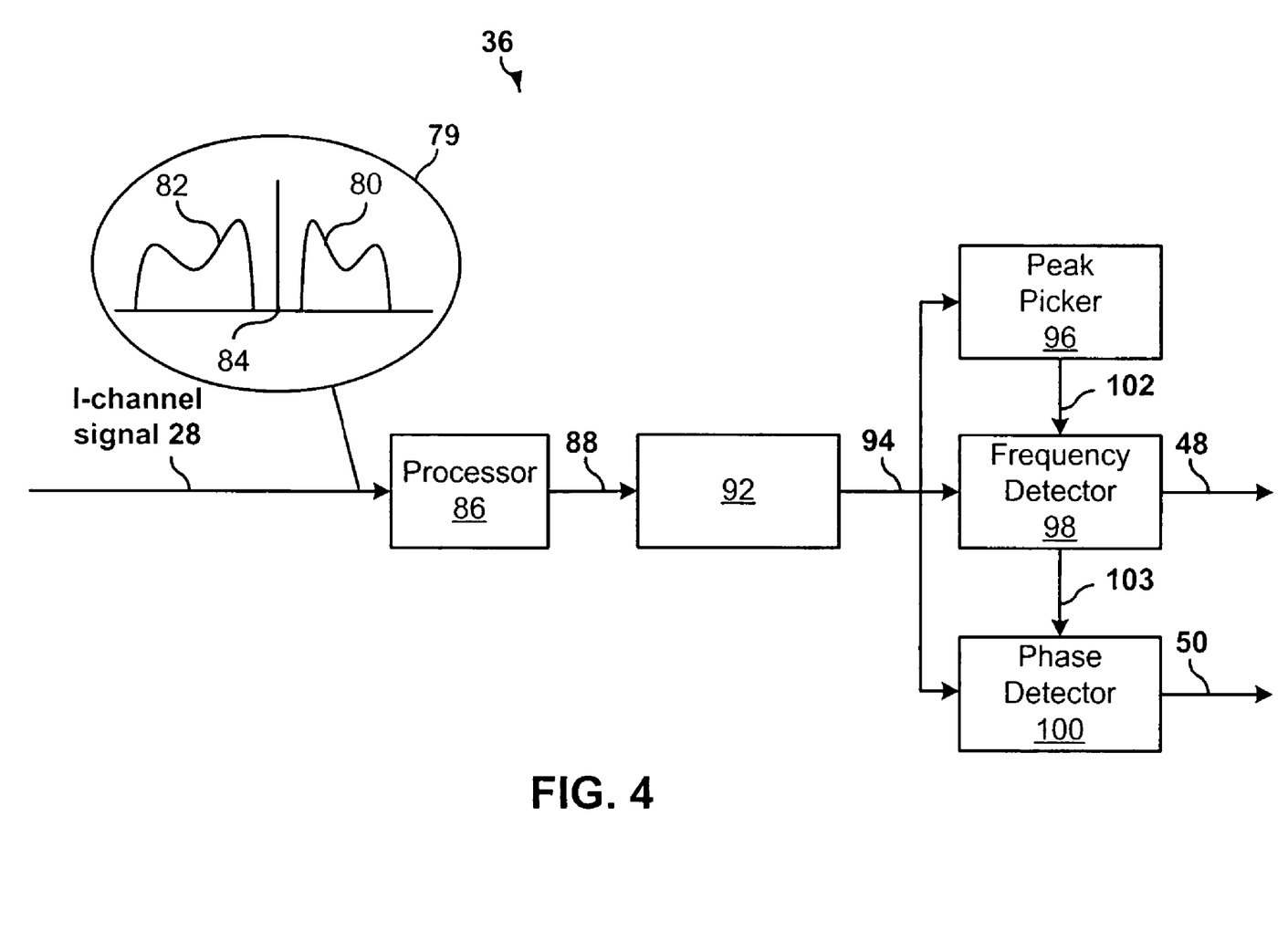
FIG. 4 show details of the carrier detector block of the AM detector depicted in FIGS. 2 and 3.

FIG. 4 details a functional description of carrier detector 36 of AM detector 32. Here, the spectrum of I-channel signal 28 is shown in callout 79. This waveform contains an upper side band (USB) signal 80 and a lower side band (LSB) signal 82 centered on a carrier frequency 84. Processor 86 may perform a windowing function (such as the application of a Hanning window) or other like function to enhance the carrier signal to produce output signal 88. Signal 88 enters processing block 92 which in this particular embodiment performs a 512-point Fast Fourier Transform (FFT) on signal 88 to produce signal 94. Peak picker 96 processes signal 94 to locate the largest magnitude in the FFT spectrum. This magnitude and location, along with the magnitudes of the two adjacent FFT samples are used to produce an output 102. Output 102, along with signal 94, are provided to frequency detector 98 to produce output 48 that contains frequency information and is provided to local oscillator 42 of FIG. 2. Phase detector 100 also receives an output from frequency detector 98 as well as signal 94 to produce output 50 that contains phase information which is supplied to local oscillator 42 of FIG. 2.

One embodiment of phase detector 100 utilizes the equation provided below to determine the phase information provided as output 51. In this equation, "$I_{peak}$" and "$R_{peak}$" represent the peak imaginary and real components of the FFT spectrum found by peak picker 96. "frac" represents the fractional frequency offset determined by frequency detector 98.

$$phase = \tan^{-1}\left(\frac{I_{peak}}{R_{peak}}\right) - frac(x)\pi$$

Figure 5:
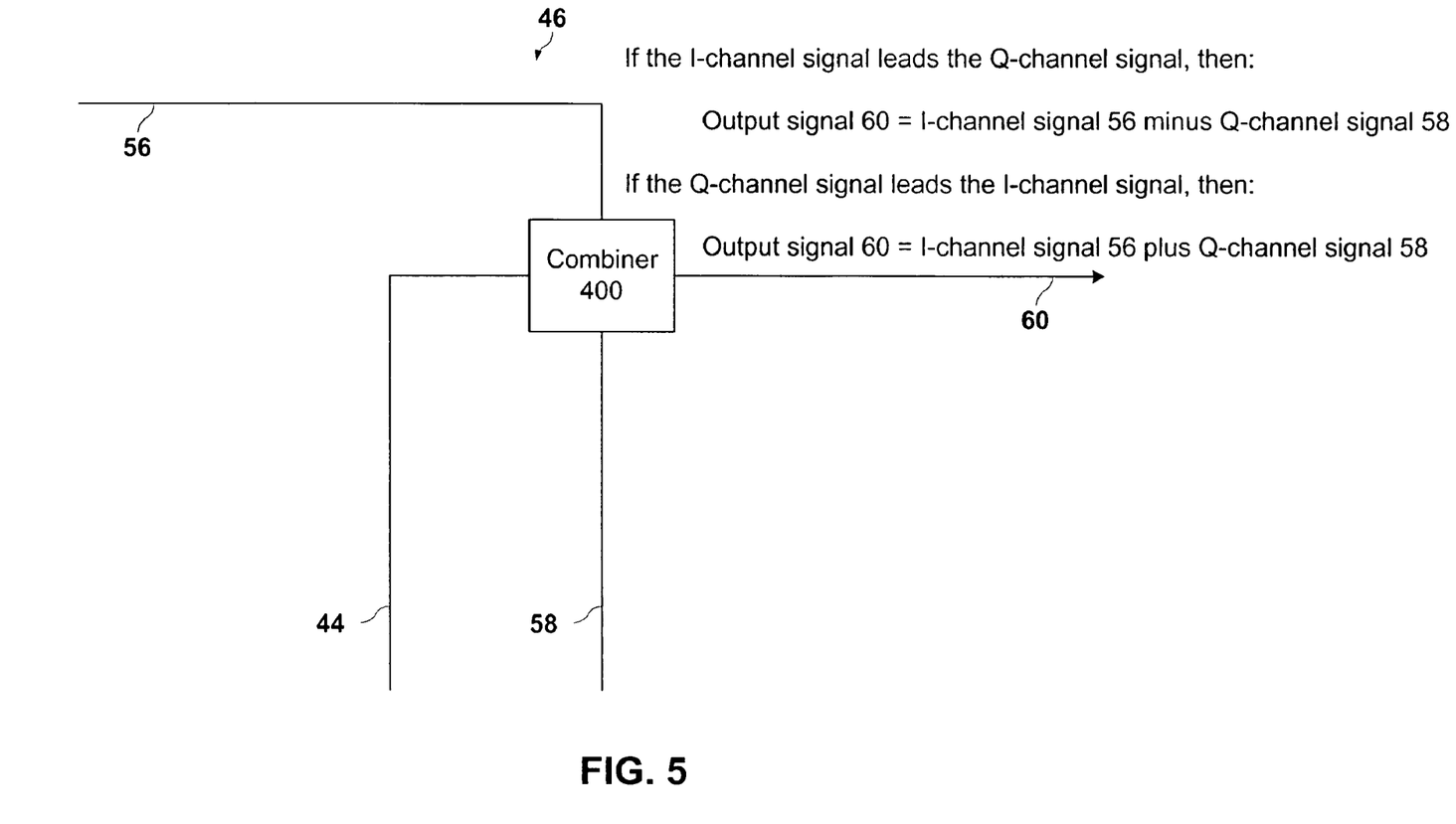
FIG. 5 shows details of the logic-controlled mixer block of the AM detector depicted in FIGS. 2 and 3.

FIG. 5 functionally depicts logic-controlled combiner 46 of FIG. 2 in further detail. Logic controlled combiner 46 receives the following inputs, output 56 of mixer 40, output 44 of phase detector 38, and signal 58 as provided by mixer 54. Logic circuitry 400 within combiner 46 adds or subtracts I-channel signal 56 and Q-channel signal 58 dependent on the output of phase detector 38. When I-channel signal 28 leads Q-channel signal 30, then output 60 of combiner 46 is the difference between I-channel signal 56 and Q-channel signal 58. However, if Q-channel signal 30 leads I-channel signal 28, then output 60 is the sum of I-channel signal 56 and Q-channel signal 58.

Figure 6:
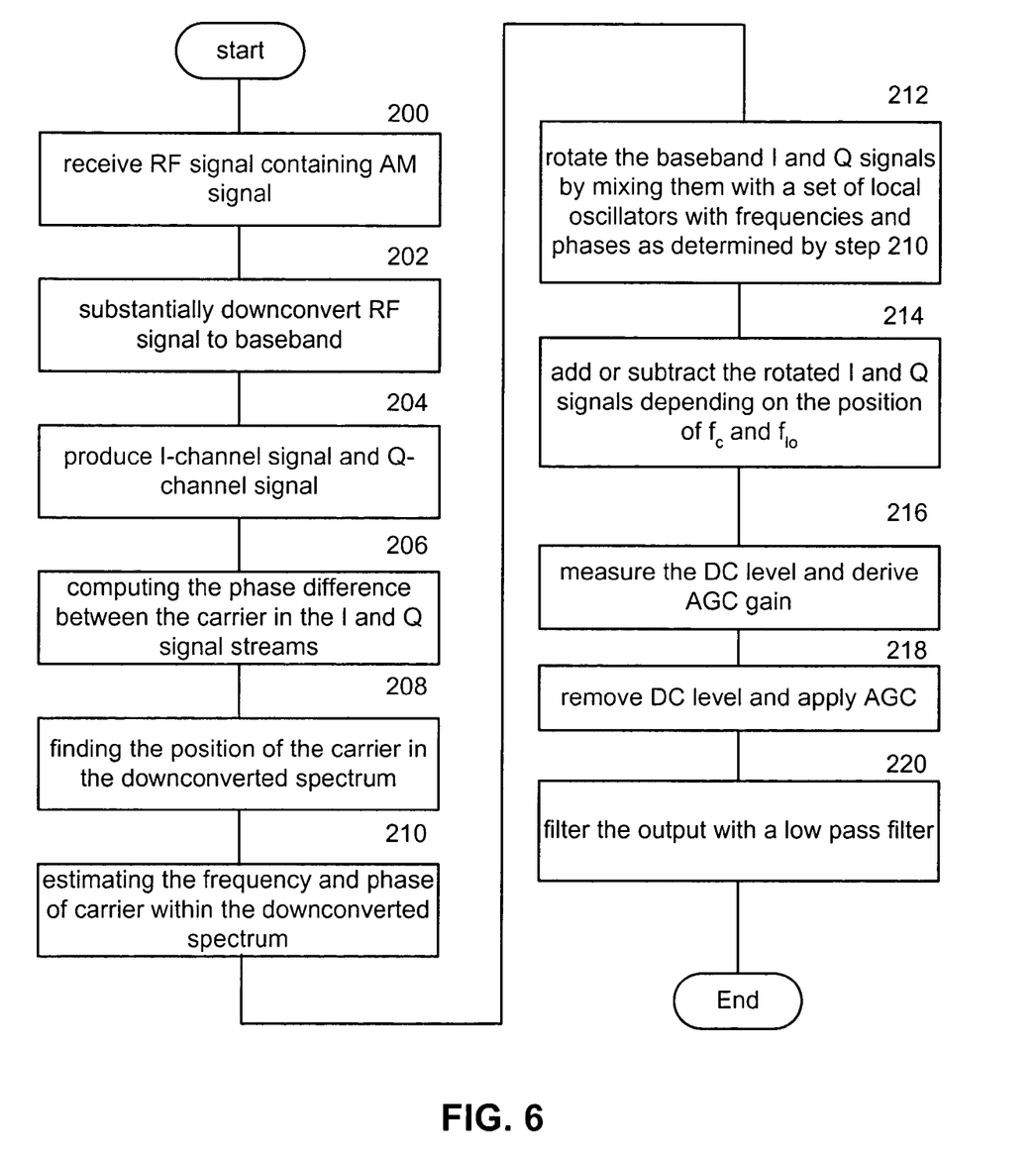
FIG. 6 is a logic flow diagram that depicts a method for improved detection of AM signals in accordance with one embodiment of the present invention.

FIG. 6 provides a logic flow diagram depicting one embodiment of the process associated with detecting an AM signal. In step 200, a radio frequency signal containing an AM signal modulated about a carrier frequency ($f_c$) is received. This RF signal is substantially downconverted to baseband with a first local oscillator in step 202. This first local oscillator has a frequency $f_{lo}$. From this downconverted RF signal, an I-channel signal and Q-channel signal are produced in step 204. Step 206 uses these signals to determine their phase relationship. Specifically, determining which signal leads will be used as an input for later processing.

Step 208 determines the location of the carrier frequency in the downconverted spectrum. This depends on the relationship of $f_c$ and $f_{lo}$, and includes both the frequency and phase difference between the first local oscillator and the carrier frequency, as shown in step 210. This determination is made by examining the I-channel signal. The results are used to produce an output signal with a second local oscillator. In step 212, the I-channel signal and Q-channel signal are mixed with the output of the second local oscillator set to produce rotated I-channel and Q-channel signals. These rotated I-channel and Q-channel signals are combined by either adding or subtracting the Q-channel signal to the I-channel signal in step 214.

Steps 216 through 220 provide further processing of the AM signal. This may involve in step 216 determining a DC level associated with the AM signal which is then removed in step 218. Step 218 may also apply automatic gain control (AGC) to produce an enhanced AM signal. Additionally, filtering may be applied to this enhanced AM signal to further improve its quality in step 220.

Figure 7:
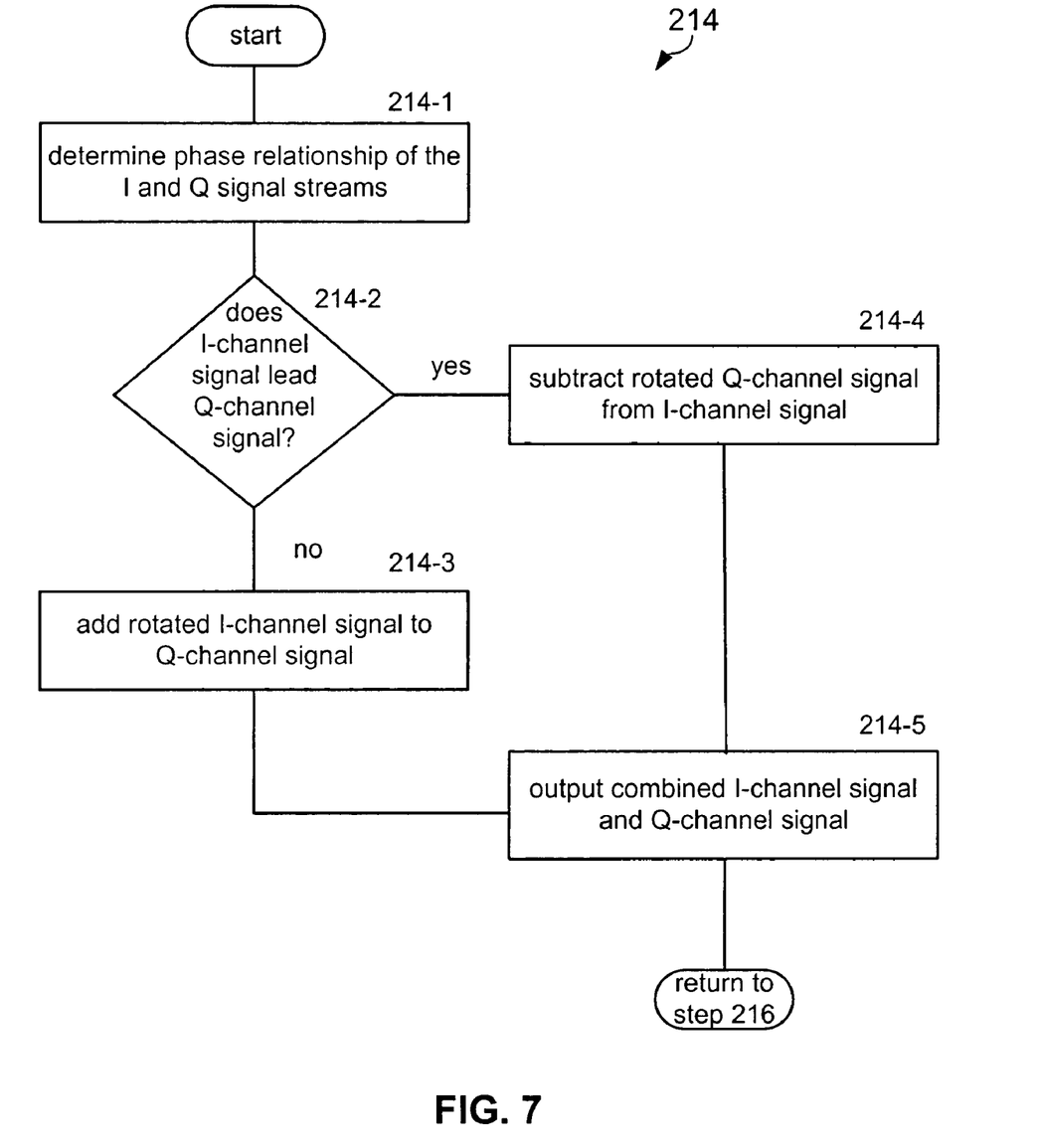
FIG. 7 is a logic flow diagram depicting how I-channel and Q-channel signals are to be combined in accordance with one embodiment of the present invention.

FIG. 7 details the logic associated with step 214 in further detail. The details of step 214 include the determination of the phase relationship of the I-channel signal and Q-channel signal in step 214-1. At decision point 214-2, it is determined whether or not the I-channel signal leads the Q-channel signal. When the I-channel signal leads the Q-channel signal, the Q-channel signal is subtracted from the I-channel signal in step 214-4. However, when the Q-channel signal leads the I-channel signal as determined by decision point 214-2, the I-channel signal and Q-channel signal are added in step 214-3. In either case, the combined output is provided in step 214-5 and processing continues as described in FIG. 6. The logic depicted in FIG. 7 is executed by a logic-controlled combiner such as logic-controlled combiner 46 depicted in FIGS. 2 and 5.

In operation the present invention allows the use of AM modulation schemes in Zero-IF receiver architectures. The present invention provides an important technical advantage by allowing zero-IF radio systems to employ Amplitude Modulation (AM) as a modulation method without experiencing the problems commonly associated with detecting AM signals at or near DC with an envelope detector, including the ineffectiveness of CIC (cascaded integrator-comb) decimation filters less and image frequency problems. This system and method also reduces or eliminates ripple and negative peak clipping associated with envelope detection at low frequencies near DC.

The present invention provides yet another technical advantage by eliminating problems associated when there is any discrepancy between the actual RF carrier frequency and the receiver's local oscillator frequency, as occurs when the system is not tuned accurately by the radio operator, or it temperature and manufacturing process variations introduce a discrepancy between desired and actual frequency output.

The present invention allows the implementation of AM modulation schemes in a Zero-IF receiver architecture used in a software-defined radio architecture. Although some or all of the system can be implemented by using analog circuits, discrete components or subassemblies combining a variety of components, alternative embodiments can be implemented by employing microprocessor that functionally implement the system using software. Such embodiments are particularly advantageous if the direct conversion receiver comprises a microcontroller with digital I/O-channels and/or a digital-to-analog converter for other purposes, and such resources can be shared for implementing the present invention. Alternative embodiments may employ the Zero-IF receiver architecture as part of a transceiver.

In summary, the present invention provides a system and method for improved detection of AM signals. More specifically, the present invention provides improved detection of AM signals in Zero-IF radio receiver architectures as implemented in a SDR environment. SDR detects AM signals contained within a received signal. This detection involves first receiving RF signals that contain the AM signal. The RF signal is downconverted using a first local oscillator having a frequency $f_{lo}$ to produce the I-channel signal and Q-channel signal. From the I-channel signal, a relationship between the carrier frequency and the frequency of the local oscillator is determined with a frequency detector. The downconverted carrier signal of the I-channel signal is used to create a second set of signals with proper phases and frequencies that can be used to rotate the I-channel and Q-channel signals to account for differences between the downconverted $f_c$ and DC. From the I-channel and Q-channel signals, a phase difference between the I-channel and Q-channel signals is determined so that the rotated I-channel and Q-channel signals can be properly combined. Properly combining the processed (rotated) I-channel and Q-channel signals results in a demodulated AM signal.

As one of average skill in the art will appreciate, the term "substantially" or "approximately", as may be used herein, provides an industry-accepted tolerance to its corresponding term. Such an industry-accepted tolerance ranges from less than one percent to twenty percent and corresponds to, but is not limited to, component values, integrated circuit process variations, temperature variations, rise and fall times, and/or thermal noise. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "operably coupled". As one of average skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As one of average skill in the art will further appreciate, some or all of a circuit may be implemented in a variety of ways using the same basic signal and logic function blocks, including but not limited to analog, digital and mixed signal components, programmable logic devices, integrated circuits, and software operating on general purpose microprocessors or microcontrollers. For example, portions of a circuit may be implemented in traditional hardware components and other portions of the circuit may be implemented using software operating on a general purpose microprocessor.

Although the present invention is described in detail, it should be understood that various changes, substitutions and alterations can be made hereto without departing from the spirit and scope of the invention as described by the appended claims.

What is claimed is:

1. A method operable to detect an amplitude modulated (AM) signal, comprising:
  receiving a radio frequency (RF) signal containing the AM signal modulated about a carrier frequency ($f_c$);

downconverting the RF signal to baseband with a first local oscillator having a frequency $f_{lo}$;

producing an in-phase (I-channel) signal and a quadrature (Q-channel) signal;

forming a frequency information output from the I-channel signal having I-channel signal frequency information:

sending the frequency information output to a second and a third local oscillator;

forming a phase information output from the I-channel signal having I-channel signal phase information:

sending the phase information output to the second and third local oscillator:

determining a relationship between $f_c$ and $f_{lo}$ from a phase difference between a downconverted carrier signal of the I-channel signal and the Q-channel signal; and forming an output from the second oscillator based on the frequency and phase information output;

forming an output from the third oscillator based on the frequency and phase information output;

mixing the output from the second oscillator with the I-channel signal to form a rotated I-channel signal;

mixing the output from the third oscillator with the Q-channel signal to form a rotated Q-channel signal; and producing a demodulated AM signal by combining the rotated I-channel and Q-channel signals based on the phase difference.

2. The method of claim 1, further comprising:

determining a DC level associated with the demodulated AM signal;

removing the DC level associated with the demodulated AM signal; and applying an automatic gain control (AGC) algorithm to produce an AGC compensated demodulated AM signal.

3. The method of claim 2, further comprising applying a low pass filter to the AGC compensated demodulated AM signal.

4. The method of claim 2, wherein the DC level is measured from the demodulated AM signal produced by mixing the I-channel signal and the Q-channel signal with the second set of local oscillators.

5. The method of claim 4, wherein the DC level provides an input to the AGC algorithm.

6. The method of claim 1, wherein the downconverted $f_c$ and phase of the I-channel signal is determined by:

sampling the I-channel signal to produce a second signal that substantially represents the I demodulated AM signal;

applying a Hanning window on the second signal to create a windowed I-channel signal; and performing a Fast Fourier Transform on the windowed I-channel signal.

7. The method of claim 1, wherein mixing the I-channel signal and the Q-channel signal with a second set of local oscillators having frequencies and phases determined by the downconverted carrier signal to produce a demodulated AM signal further comprises:

rotating the I-channel signal and the Q-channel signal with the second set of local oscillators;

combining the I-channel signal and the Q-channel signal depending on the relationship between $f_c$ and $f_{lo}$.

8. The method of claim 7, wherein combining the I-channel signal and the Q-channel signal comprises: adding the I channel signal and the Q-channel signal when $f_{lo}$ is greater than $f_c$; and subtracting the Q-channel signal from the I-channel signal when $f_c$ is greater than $f_{lo}$.

9. The method of claim 1, wherein an AGC gain of the AGC algorithm comprises multiplying a constant and a desired RMS level divided by a measured DC level.

10. An apparatus operable to detect an amplitude modulated (AM) signal, comprising:

a receiver operable to receive a radio frequency (RF) signal containing the AM signal modulated about a carrier frequency $f_c$; and a processing circuit operably coupled to a first local oscillator having a frequency $f_{lo}$ and a second local oscillator, wherein the processing circuit is operable to: downconvert the RF signal with a first local oscillator having a frequency $f_{lo}$; and produce an in-phase (I) signal and a quadrature (Q) signal from the RF signal;

determine a relationship between $f_c$ and $f_{lo}$ from a phase difference between a downconverted carrier signal of the I-channel signal and the Q-channel signal;

mix the I-channel signal and the Q-channel signal respectively with first and second local oscillators having frequencies and phases determined by the downconverted carrier signal; and combine the mixed I and Q channel signals based on the phase difference between the I and Q channel signals to output a demodulated AM signal.

11. The apparatus of claim 10, wherein the processing circuit is further operable to: determine a DC level associated with the demodulated AM signal; remove the DC level associated with the demodulated AM signal; and apply an automatic gain control (AGC) algorithm to produce an AGC compensated demodulated AM signal.

12. The apparatus of claim 11, further comprising a low pass filter operable to filter the AGC compensated demodulated AM signal.

13. The apparatus of claim 11, wherein the DC level is measured from the demodulated AM signal produced by mixing the I demodulated AM signal and the Q demodulated signal with the second local oscillator.

14. The apparatus of claim 11, wherein the processing circuit is further operable to: determine the downconverted $f_c$ and phase of the I-channel signal by:

sampling the I demodulated AM signal to produce a second signal that substantially represents the I demodulated AM signal;

applying a Hanning window on the second signal to create a windowed I-channel signal; and performing a Fast Fourier Transform on the windowed I-channel signal.

15. The apparatus of claim 11, wherein the processing circuit is further operable to: rotate the I-channel signal and the Q-channel signal with the second set of local oscillators; and combine the I-channel signal and the Q-channel signal depending on the relationship between $f_c$ and $f_{lo}$.

16. A digital amplitude modulated (AM) signal detector comprising:

a receiver operable to receive a radio frequency (RF) signal containing the AM signal modulated about a carrier frequency ($f_c$);

a frequency detector operable to detect $f_c$ within the RF signal; a first local oscillator having a frequency $f_{lo}$;

second and third local oscillators;

a processing circuit operably coupled to the first local oscillator, wherein the processing circuit is operable to:

downconvert the RE signal with a first local oscillator having a frequency $f_{lo}$; and produce an in-phase (I) signal and a quadrature (Q) signal;

a phase detector operable to determine a phase difference between the I-channel signal and the Q-channel signal;

a set of mixers operable to multiply the I-channel signal and the Q-channel signal with an output of the second set of local oscillators to produce mixed I and Q channel signals; and combine the mixed I and Q channel signals based on the phase difference between the I and Q channel signals to produce a demodulated AM signal.

17. The digital amplitude modulated (AM) signal detector of claim 16, further comprising circuitry operable to:

determine a DC level associated with the demodulated AM signal;

remove the DC level associated with the demodulated AM signal; and apply an automatic gain control (AGC) algorithm to produce an AGC compensated demodulated AM signal.

18. The digital AM signal detector of claim 17, further comprising a low pass filter operable to filter the AGC compensated demodulated AM signal.

19. The digital AM signal detector of claim 17, wherein: the first local oscillator substantially matches $f_{lo}$ to $f_c$ as detected by the frequency detector; and a logic controlled combiner operable to combine rotated I-channel signal and the Q-channel signal signals by adding or subtracting the signals based on a phase difference between the I-channel signal and the Q-channel signal.

* * * * *

UNITED STATES PATENT AND TRADEMARK OFFICE
CERTIFICATE OF CORRECTION

PATENT NO. : 7,639,821 B2 Page 1 of 1
APPLICATION NO. : 11/031121
DATED : December 29, 2009
INVENTOR(S) : Richard L. Zinser It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1392 days.

Signed and Sealed this

Twenty-first Day of December, 2010

David J. Kappos
*Director of the United States Patent and Trademark Office*